United States Patent
Beyerlein et al.

(10) Patent No.: US 9,013,840 B2
(45) Date of Patent: Apr. 21, 2015

(54) ADAPTIVE LINE FILTER

(75) Inventors: Walter Beyerlein, Bubenreuth (DE);
Andre Gebhardt, Markt Erlbach (DE);
Tobias Graβl, Erlangen (DE); Thomas Weidinger, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 337 days.

(21) Appl. No.: 13/485,860

(22) Filed: May 31, 2012

(65) Prior Publication Data

US 2013/0141182 A1  Jun. 6, 2013

(30) Foreign Application Priority Data

Jun. 1, 2011 (DE) .......................... 10 2011 076 877

(51) Int. Cl.
| | |
|---|---|
| *H02H 3/00* | (2006.01) |
| *H02H 9/08* | (2006.01) |
| *H02H 9/02* | (2006.01) |
| *H03H 21/00* | (2006.01) |
| *H03H 7/42* | (2006.01) |
| *H02J 7/00* | (2006.01) |
| *H02J 9/00* | (2006.01) |
| *H03H 7/01* | (2006.01) |

(52) U.S. Cl.
CPC ............. *H02H 9/02* (2013.01); *H03H 21/0007* (2013.01); *H03H 7/427* (2013.01); *H03H 7/0153* (2013.01)

(58) Field of Classification Search
USPC .......................................................... 361/42
See application file for complete search history.

(56) References Cited

U.S. PATENT DOCUMENTS

| | | | |
|---|---|---|---|
| 4,544,899 A | 10/1985 | Townsend et al. | |
| 7,558,091 B2 * | 7/2009 | Nishi | ......................... 363/56.09 |
| 8,310,098 B2 * | 11/2012 | Kumar et al. | ................... 307/66 |

OTHER PUBLICATIONS

German Office Action dated Jan. 10, 2012 for corresponding German Patent Application No. DE 10 2011 076 877.7 with English translation.

* cited by examiner

*Primary Examiner* — Dharti Patel

(74) *Attorney, Agent, or Firm* — Lempia Summerfield Katz LLC

(57) ABSTRACT

A device for improving the filter effect of a filter connected up between an electrical energy source and a source of interference is provided. The filter is configured to feed back interference transients from ground to an input of the source of interference generating the interference transients. The device includes a measuring device for determining a leakage current flowing through the filter and a final control element configured to modify a limit frequency of the filter such that the leakage current through the filter is damped to below a predefined level if the measuring device detects the leakage current.

20 Claims, 4 Drawing Sheets

ADAPTIVE LINE FILTER

This application claims the benefit of DE 10 2011 076 877.7, filed on Jun. 1, 2011.

BACKGROUND

The present embodiments relate to a device for improving the filter effect of a filter.

Line filters are electronic components for reducing emitted interference caused by, among other things, ground leakage currents.

Ground leakage currents are undesired currents that flow to ground from a fault-free power circuit (e.g., via a ground capacitor) represented, for example, by a conductive part such as a grounded heat sink or a cable shielded with ground potential. Ground leakage currents may, for example, be caused by power electronics energy transformers that, as a result of switching operations, inject high-frequency switching transients into the power circuit. The ground circuit may close because another electrical component in the power circuit absorbs the ground leakage current again and feeds the ground leakage current back to the source of interference in the power circuit.

Ground leakage currents may be so energy-rich that the ground leakage currents interfere with or even damage the working of the electrical component absorbing the ground leakage current. In addition, the electrical lines between this electrical component and the source of interference act like an antenna and emit interference as a result of the ground leakage currents. This interferes with the functioning of other electrical components in the vicinity of the ground circuit. Excessively high ground leakage currents represent a danger for people, as the ground leakage currents may also discharge via the human body if conductive components are touched. Hence, an excessively large expansion of the ground circuit is to be prevented.

This is conventionally effected via the line filters, which short-circuit the input of the source of interference using interference-suppression capacitors for ground leakage currents in the ground and thus do not allow the ground circuit to extend to other electrical components in the power circuit. Because of the limited effect of the interference-suppression capacitors, chokes are also provided in order to damp the ground leakage currents that may not be fed back via the interference-suppression capacitors at the input of the source of interference. Since these ground leakage currents that may not be grounded may still be very energy-rich, the chokes have high inductance values that make the chokes expensive and take up a lot of space in a device for increasing electromagnetic compatibility.

SUMMARY AND DESCRIPTION

The present embodiments may obviate one or more of the drawbacks or limitations in the related art. For example, space may be saved costs may be reduced for a device for reducing high-frequency leakage currents generated by a source of interference.

In a grounded power circuit, no active currents flow via the connection to ground if the power circuit is working fault-free. A power circuit for supplying electrical energy is not to be closed by a connection to ground, since otherwise, certain safety devices such as a residual-current circuit-breaker, for example, do not work. In practice, the currents supplied by the electrical energy source to supply an electrical consumer flow between the phases. The currents may also discharge via a directly grounded conductor. For this reason, a line filter referred to in the introduction for reducing interference transients in the form of ground leakage currents may also cover the frequency range of the power currents and thus may be configured across the whole available frequency range. In the event of a fault, if, for example, a phase fails, the power currents may be fed back to the electrical energy source via the line filter and ground instead of via the phase, which has however failed. As a result, the leakage currents become too large and may possibly overload the line filter. The line filter may be modified in the case of such faults so that the power currents may not be discharged via the line filter. In the simplest case, the capacitor discharging the interference transients may be reduced to the extent that due to the increased impedance, the ground leakage currents are reduced in the frequency range of the power currents.

In one embodiment, a device for improving the filter effect between an electrical energy source and a source of interference of a connected filter, which is configured to feed back interference transients from ground to the input of the source of interference generating the interference transients, is provided. The device includes a measuring device for detecting a leakage current flowing through the filter and a final control element that is configured to modify a limit frequency of the filter such that the leakage current through the filter is damped to below a predefined level if the measuring device detects the leakage current. Due to the final control element, the filter may be adjusted to a fault scenario in line with the situation, so that different filter components of the filter, which provide that the filter works in the event of a fault and in normal operation, may be combined. This not only saves space but also cuts the cost of the filter. The leakage current is, for example, a power current from the electrical energy source misrouted in the filter, which differs from a current path envisaged for the power current. The envisaged current path is routed through the filter and the source of interference.

In one embodiment, the operating control may include a switch that is configured to interrupt the leakage current through the filter if the measuring device detects the leakage current. In contrast to conventional fault mechanisms such as, for example, a residual-current circuit-breaker, which establishes that a ground leakage current is present without knowing the cause, the specified device may protect the component connected up to the filter. This reduces the likelihood that the device erroneously activates as a result of an unknown fault.

In another embodiment, the filter may have at least one capacitor, and the final control element for modifying the limit frequency of the filter may be configured to increase the capacitor. This embodiment of the device enables capacitors in the filter to be configured to filter the interference transients across a wider frequency range. Thus, the filter may be fitted with lower-inductive chokes, as a result of which the line filter may not only be achieved at a lower price but may also be constructed more compactly. If the increase remains limited, the filter may be further used in the event of a fault, so that the power supply to a consumer need not be interrupted. This represents an advantageous difference from other network protection mechanisms (e.g., a fuse or a residual-current circuit-breaker) that may fully interrupt the electrical energy supply.

In one embodiment, the electrical energy source for the multiphase electrical energy output to the source of interference and the filter for feeding back interference transients from ground to the input of the source of interference may be provided in all phases including directly grounded conductors. The measuring device for detecting the leakage current may be configured to detect an asymmetrical electrical energy output from the electrical energy source. Because, in the case of an asymmetry of the electrical energy source, a very high ground leakage current, which in the worst case, is the failure of one phase of the electrical energy source, may flow, the leakage current may be effectively reduced with the present embodiments. Conventional line filters may, in order to reduce the leakage currents for a comparable case, use chokes (e.g., common-mode chokes with a high inductance) that are manufactured using special winding procedures in order to not unnecessarily increase the mutual inductance. Chokes of this type are very expensive and may be dispensed with by using the specified device.

In one embodiment, the measuring device for detecting the asymmetrical electrical energy output may be provided on the basis of the phase currents of the electrical energy source, the phase voltages of the electrical energy source, the common-mode interference in the individual phases between those of the electrical energy source (6, 54, 80) and the source of interference, and/or a voltage drop from an artificial neutral point in the filter to ground. These methods may be achieved with known measuring devices at low cost. In addition, different measurement principles may be provided for determining the deviation and to increase reliability, may be compared with one another.

In one embodiment, a filter for relaying electrical energy from an electrical energy source to a source of interference and for feeding back interference transients from ground to the input of the source of interference generating the interference transients is provided. The filter includes one embodiment of the device.

In one embodiment, the filter may include a first capacitor and a second capacitor that is connected in parallel to the first capacitor. In this case, the first capacitor is configured to transmit interference transients with the frequency of the leakage current, and the second capacitor is configured to transmit interference transients with a frequency different from the frequency of the leakage current. In this way, the second capacitor may be conventionally dimensioned to filter ground leakage currents, whereas the first capacitor may also be dimensioned to conduct as high a current as possible. In this way, the limit frequency of the filter may be moved nearer to the frequency of the electrical energy source by modifying the first capacitor.

In one embodiment, the final control element may be configured to electrically isolate the first capacitor from the filter if the measuring device detects the leakage current. A limited proportion of predefined connections that the specified device may, if required, quickly select and adjust in the filter, may be introduced so that as fast a reaction as possible is provided in the event of a fault.

In addition, present embodiments specify a network for supplying electrical energy to an electrical consumer from an electrical energy source. The network includes the electrical consumer, an electrical transformer for transforming a line voltage from the network into a load voltage for the electrical consumer and a specified filter. The electrical transformer is the source of interference.

In an embodiment, the predefined frequency may be the frequency of an electrical energy source, to which the source of interference is connected. The capacitor is protected against an overload. The filter protected by the device is thereby not only more proof against failures but is also longer lasting, since the filter may be effectively protected against currents that may reduce service life.

In one embodiment, the electrical transformer may be a rectifier. In an active mode, the rectifier may be used for power factor correction in the network.

In another embodiment, the final control element may be provided in the event of asymmetrical electrical power output to switch the electrical transformer into a passive operating mode, thus preventing the ground leakage currents generated by the source of interference, which may be less effectively filtered by modifying the capacitor in the filter, from being reduced.

In an alternative embodiment, the final control element may be provided in the case of an asymmetrical electrical power output to reduce the power output of the electrical transformer, thereby providing that the ground leakage currents generated by the source of interference are generated at a lower level.

The present embodiments also include a method for protecting a filter that is configured to feed back interference transients from the ground to the input of a source of interference generating the interference transients. The method includes the acts of detecting a leakage current flowing through the filter and modifying a limit frequency of the filter such that the leakage current through the filter is damped to below a predefined level if the leakage current is detected.

Developments of the method may be acts that achieve the features of the specified device, of the filter or of the network.

DETAILED DESCRIPTION OF THE DRAWINGS

Figure 1:
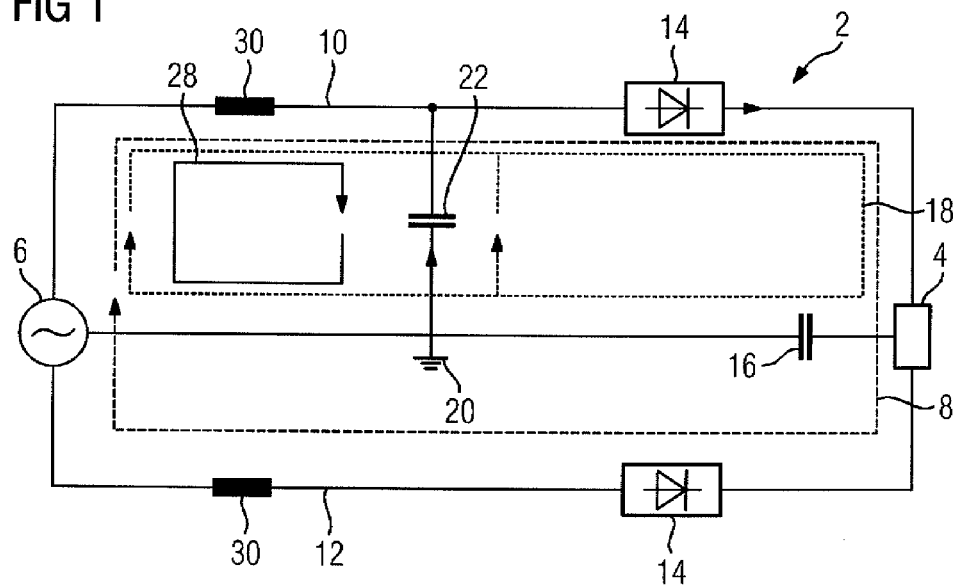
FIG. 1 shows a network with a conventional line filter circuit.

FIG. 1 shows a network 2, in which an electrical consumer 4 is supplied with electrical energy from a symmetrical electrical energy source 6 via an electric circuit with power current 8. The power current 8 flows through a first phase 10 and a second phase 12. The power currents 8 of individual phases 10, 12 (e.g., two phases) are shifted with respect to one another by a half-wave. The same applies for voltages of the individual phases 10, 12. Apart from through the two phases 10, 12, no other power currents flow, in the case of a fault-free electrical energy supply, to the electrical consumer 4.

To adapt the electrical energy from the electrical energy source 6 to the requirements of the electrical consumer 4, an energy converter is provided. In one embodiment, the energy converter includes a rectifier 14. The rectifier 14 is arranged in the two phases 10, 12 and may be operated in an active mode, in which the rectifier 14 rectifies an alternating voltage from the electrical energy source 6 by switching operations, and in a passive mode, in which the rectifier 14 rectifies the alternating voltage with diodes.

In the active mode of the rectifier 14, the switching operations generate transient interference currents that are conducted from the electrical consumer 4 via a ground capacitor 16 as a ground leakage current 18 to ground 20. The electric circuit of the ground leakage current 18 is closed via an internal resistor in the electrical energy source 6. In FIG. 1, for the sake of clarity, only the electrical circuit of the ground leakage current 18 for the first phase 10 is drawn in. A corresponding ground leakage current circuit exists for the second phase 12. The following considerations correspondingly apply for both ground leakage current circuits.

The electrical conductor lines between the electrical energy source 6 and the electrical consumer 4 act like an antenna and stimulated by the ground leakage current 18, emit interference emissions into the vicinity. The interference emissions interfere with the functioning of other electrical devices. To limit these interference emissions, the ground leakage current 18 is limited by a line filter. The line filter is represented by a capacitor 22 that feeds back the ground leakage current 18 directly to an input of the rectifier 14 and thus keeps conductor lines, via which the ground leakage current 18 may flow, short. The capacitor 22 is referred to below as a line filter capacitor 22. A line filter capacitor of this type also connects the input of the rectifier 14 in the second phase 12 to ground 20.

The line filter capacitor 22 is dimensioned so that for all conceivable frequencies, the line filter capacitor 22 feeds back the ground leakage current 18 to the input of the rectifier 14. The line filter capacitor 22 may be wide-band and thus be dimensioned as large as possible in order also to effectively filter a ground leakage current 18 with low frequencies. This dimensioning may be limited by a possible malfunction of the electrical energy source 6 or of the electrical consumer 4, which results in a leakage current 28 through the line filter capacitor 22. If people touch, this may result in excessively high currents being discharged through the people.

An example of a malfunction 24 is an asymmetrical power output of the electrical energy source 6. This causes common-mode interference between the two phases 10, 12 and ground.

Common-mode interference is a co-phasal current or a co-phasal voltage between the phases 10, 12. Common-mode interference does not cause any difference in potential between the two phases 10, 12, but merely from the individual phases 10, 12 to ground 20. If the line filter capacitor 22 is configured to conduct currents in the frequency range of the power current 8, the common-mode interference caused by the asymmetrical power output hence results in the leakage current 28 between the phases 10, 12 to ground 20. Because in the worst case, the common-mode interference is caused by the failure of a phase 10, 12, the leakage current 28 may in an extreme case become too large, so that the line filter capacitor 22 and/or conductors of the line filter capacitor 22 are damaged. Capacitors that may conduct common-mode interference (e.g., lie in a branch leading to ground 20 in the network 2) are also referred to as Y-capacitors.

The opposite of common-mode interference is normal-mode interference, which is characterized by an opposite-phase current or an opposite-phase voltage between the phases 10, 12. The phase opposition causes a difference in potential between the phases 10, 12. The power current 8 in FIG. 1 emitted by the electrical energy source 6 likewise oscillates in a push-pull mode because the symmetrical power currents 8 are each shifted by a half-wave in the individual phases 10, 12. Capacitors not shown in FIG. 1, which lie in a branch that may conduct push-pull modes, are also referred to as X-capacitors.

Capacitors that filter common modes and push-pull modes are also referred to as XY-capacitors.

Conventionally, the occurrence of a leakage current 28 is prevented by limiting the line filter capacitor 22. As a result of this, the line filter capacitor 22 has a high resistance in the frequency range of the power current 8 and thus is not conductive. As a result, the filter effect of the Y-capacitors is restricted, which is why special chokes 30 that require more space and are more expensive are used to improve the filter effect. The chokes 30 are also configured to carry a sufficiently high current, because the chokes 30 lie in the electric circuit of the power current 8 and hence carry the power current 8. Special high-cost winding procedures are used for the chokes 30 in order to achieve sufficient inductance values to prevent an increase in mutual inductance.

Figure 2:
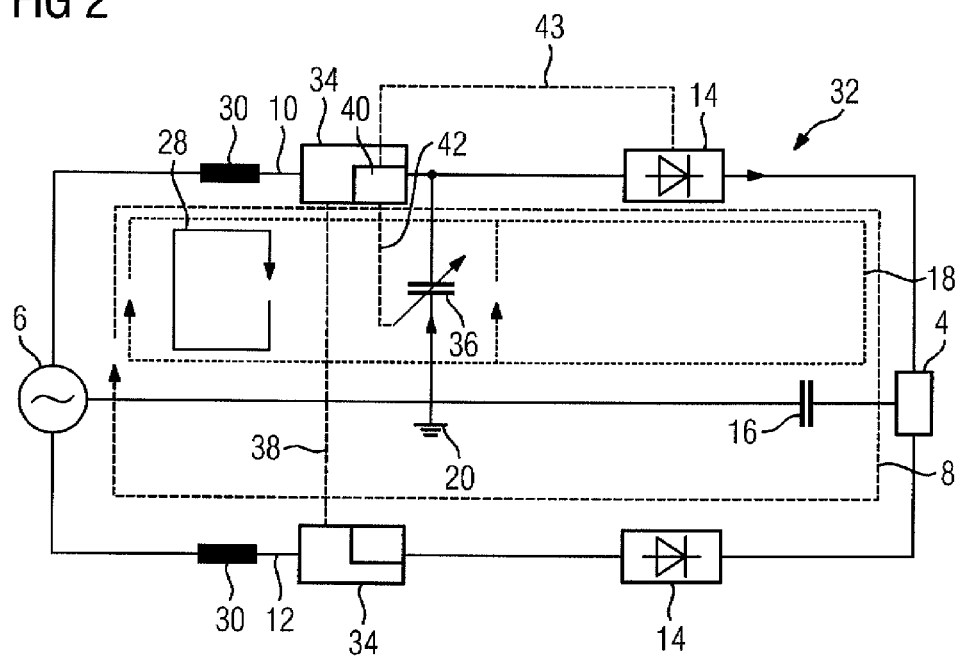
FIG. 2 shows a network with a line filter circuit that is controlled by one embodiment of a device.

In order to avoid the use of this type of expensive choke 30 in the electrical circuit of the power current 8, the capacitance values of the line filter capacitor 22 are adjusted if a leakage current 28 occurs. A network 32 with a first exemplary embodiment for this is shown in FIG. 2. In FIG. 2, the same elements are provided with the same reference characters as in FIG. 1 and are not described again.

The network 32 has an adjustable line filter capacitor 36 for filtering the ground leakage currents 18 described in FIG. 1. As in FIG. 1, the following considerations on the adjustable line filter capacitor 36 are for reasons of clarity merely shown between the first phase 10 and ground 20. A corresponding adjustable line filter capacitor is also connected up between the second phase 12 and ground 20. In the absence of faults in the network, the line filter capacitor 36 is adjusted such that the line filter capacitor 36 may conduct ground leakage currents 18 in the frequency range of the power current 8.

In the event of a fault, if a leakage current 28 occurs through the adjustable line filter capacitor 36, a value is reduced, and a leakage current 28 through the adjustable line filter capacitor 36 is prevented. To establish the occurrence of a leakage current 28, measuring devices 34 are arranged in each of the phases 10, 12 of the network 32. These may exchange information with one another via a data line 38 and determine the leakage current 28 in different ways.

In one embodiment, the symmetrical electrical power output may be utilized and whether the voltages or the currents in the individual phases 10, 12 add up to zero at every point in time compared to ground may be monitored. If not, there is an asymmetry present, which results in the leakage current 28, if the adjustable line filter capacitor 36 is adjusted to carry ground leakage currents 18 in the frequency range of the power current 8. The advantage of monitoring the voltages is that the voltages may continue to be monitored even in the event of an asymmetry in order to determine the elimination of the fault and to automatically adjust the line filter capacitor 36 to normal operation.

Common-mode interference in the network 32 may be derived from the monitored currents in the phases 10, 12 and may alternatively be employed to determine the leakage current. To determine the common-mode interference, the measuring device 34 may also be inserted in series to the adjustable line filter capacitor 36 in order to measure a common-mode interference directly. Another alternative is to connect up the measuring device 34 in the network 32, as shown in FIG. 2. A separate current transformer or an auxiliary winding on the chokes 30 may be provided to detect the common-mode interference.

The symmetry of the electrical power output may be employed to establish whether a leakage current 28 has occurred. An artificial neutral point not shown in FIG. 2 may be introduced. The artificial neutral point connects the two phases to one another via X-capacitors. The neutral point may be grounded via a Y-capacitor. In the absence of faults, no voltage may drop at the Y-capacitor. If the voltage is nevertheless measured, the voltage relates either to the leakage current 28 or to the ground leakage current 18. The leakage current 28 may be determined using low-pass filtering.

If the measuring device 34, for example, in the first phase 10, detects an over-large leakage current 28, an operating control 40 in the measuring device 34 may adjust the adjustable line filter capacitor 36 via a first actuating signal 42 such that neither the leakage current 28 nor ground leakage currents 18 with frequencies in the range of the power current 8 may flow through the adjustable line filter capacitor 36.

In return, this provides that ground leakage currents 18 with frequencies in the range of the power current 8 may no longer be fed back through the modified line filter capacitor 36 directly to the input of the rectifier 14 and thereby filtered, or the filter effect diminishes for transient ground discharge currents 18. In order to prevent interference being emitted by the ground leakage currents 18 flowing via the electrical energy source 6, the operating control 40 may transfer the rectifier 14 to the aforementioned passive mode via a second actuating signal 43 or deactivate the rectifier 14, thereby reducing the occurrence of the ground leakage currents 18.

Figure 3:
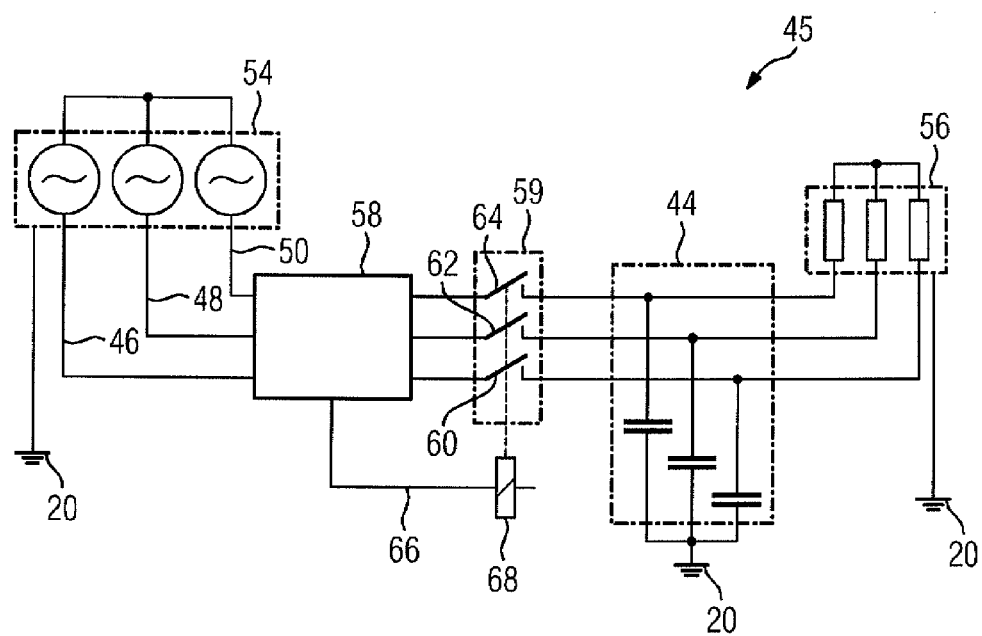
FIG. 3 shows a network with a line filter circuit that is controlled by another embodiment of a device.

FIG. 3 shows a line filter circuit 44 in a network 45 with three phases 46, 48, 50. The line filter circuit 46 is controlled by a device 58 according to a second exemplary embodiment. In FIG. 3, the same elements are provided with the same reference characters as in FIGS. 1 and 2 and are not described again.

The network 45 is supplied with electrical energy via a three-phase energy source 54. The individual voltages in the three-phase energy source 54 are each shifted by 120°, so that the vector total of all three voltages is zero at any time. Because a rotating field may easily be generated with the three-phase energy source 54, the electrical current emitted by the rotating field may also be referred to as three-phase current.

The electrical energy is used in the network 45 to supply a three-phase consumer 56 with three different load resistors that are connected between the individual phases 46, 48, 50. The resistors of the three-phase consumer 56 belong to a single electrical device (e.g., an asynchronous motor) that is operated in a star connection. In this case, the power current in fault-free operation merely flows between the phases 46, 48, and 50. The ground 20 remains free of power current.

The line filter circuit 44 protects the network 45 against the consequences of ground leakage currents in the same way as the line filter capacitors 22, 36 in FIGS. 1 and 2.

As in FIGS. 1 and 2, some of the power current may also be discharged in the network 45 via the line filter circuit 44, as a result of a fault and may be fed back thereto via the internal resistor in the electrical energy source 54 if the capacitors in the network line filter circuit 44 are configured to carry ground leakage currents with frequencies in the range of the power current. This type of fault may be traced back to a failure of one of the phases 46, 48, 50, in which the flow of current to the three-phase load 56 is interrupted on the corresponding phase.

In order to prevent a leakage current 28 in the range of the power current 8 through the capacitors of the line filter circuit 44, a measuring device 58 that, as in FIG. 2, monitors the phases 46, 48, 50 for a fault and establishes whether the capacitors of the line filter circuit 44 are charged with power current, is arranged in the network 45. The measuring device 58 is connected to a line contactor 59 with a switch 60, 62, 64 in each phase 46, 48, 50. In the event of a fault, if the capacitors of the line filter circuit 44 carry a power current, the measuring device 58 operates a relay 68 via a trigger signal 66 and interrupts the phases 46, 48, 50 via the switches 60, 62 64.

The network 45 may likewise be operated in a delta connection, without the functional principle of the measuring device 58 and of the line contactor 59 having to be altered.

Figure 4:
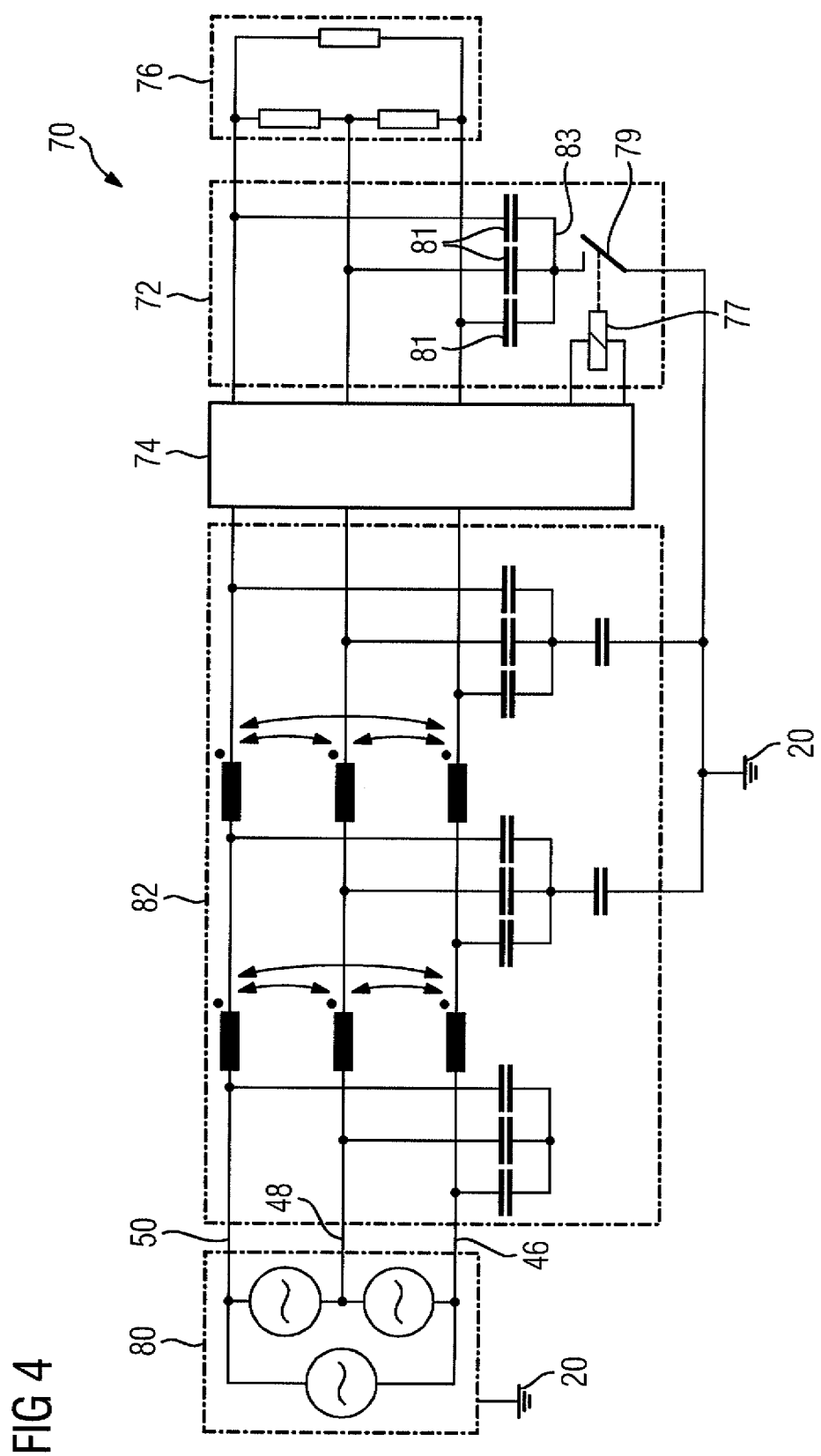
FIG. 4 shows a network with a line filter circuit that is controlled by yet another embodiment of a device.

FIG. 4 shows a network 70 with a line filter circuit 72 that is controlled by a measuring device 74 according to a third exemplary embodiment. In FIG. 4, the same elements are provided with the same reference characters as in FIGS. 1 to 3 and are not described again.

In the network 70, a load 76 is supplied with electrical energy via the three phases 46, 48, 50 from a three-phase electrical energy source 80 in a delta connection. The filter 72 controlled by the measuring device 74 as well as an uncontrolled filter 82 are arranged on the phases 46, 48, 50, and as in the preceding exemplary embodiments, may feed back ground leakage currents from ground 20 to the input of an electrical transformer (not shown).

In FIG. 4, the uncontrolled filter 82 has coupled network balance coils (not referred to further) on the phases 46, 48, 50 and X-capacitors between the phases 46, 48, 50, via which network asymmetries may be equalized on the phases 46, 48, 50. The ground leakage currents may be fed back via Y-capacitors and XY-capacitors to the source of the ground leakage currents (not shown). The Y- and XY-capacitors of the uncontrolled filter 82 are dimensioned such that the Y- and XY-capacitors conduct ground leakage currents in the frequency range of the power current from the electrical energy source 80 only in so far as a particular threshold value is not exceeded.

Such ground leakage currents may be filtered by the controlled filter 72. The controlled filter 72 has a switch 79 as well as three capacitors 81, via which the three phases 46, 48, 50 are connected up to form a star connection. Normal-mode interference may thus be filtered via capacitors 81, so that the capacitors act like X-capacitors. If the neutral point 83 of the controlled filter 72 is connected to ground 20 via the switch 79, the capacitors 81 may thus also ground common-mode interference, so that the capacitors 81 act like XY-capacitors.

The switch 79 is controlled by the measuring device 74 via a relay 77, which as in the preceding exemplary embodiments detects a leakage current through the capacitors 81 to ground 20 and checks whether the leakage current is too high. If so, the measuring device 74 may isolate the controlled filter 72 from ground 20. The switch 79 is configured as a make contact. This provides that in the event of a failure of the current to control the relay 77, the controlled filter 72 remains isolated from the network.

Figure 5:
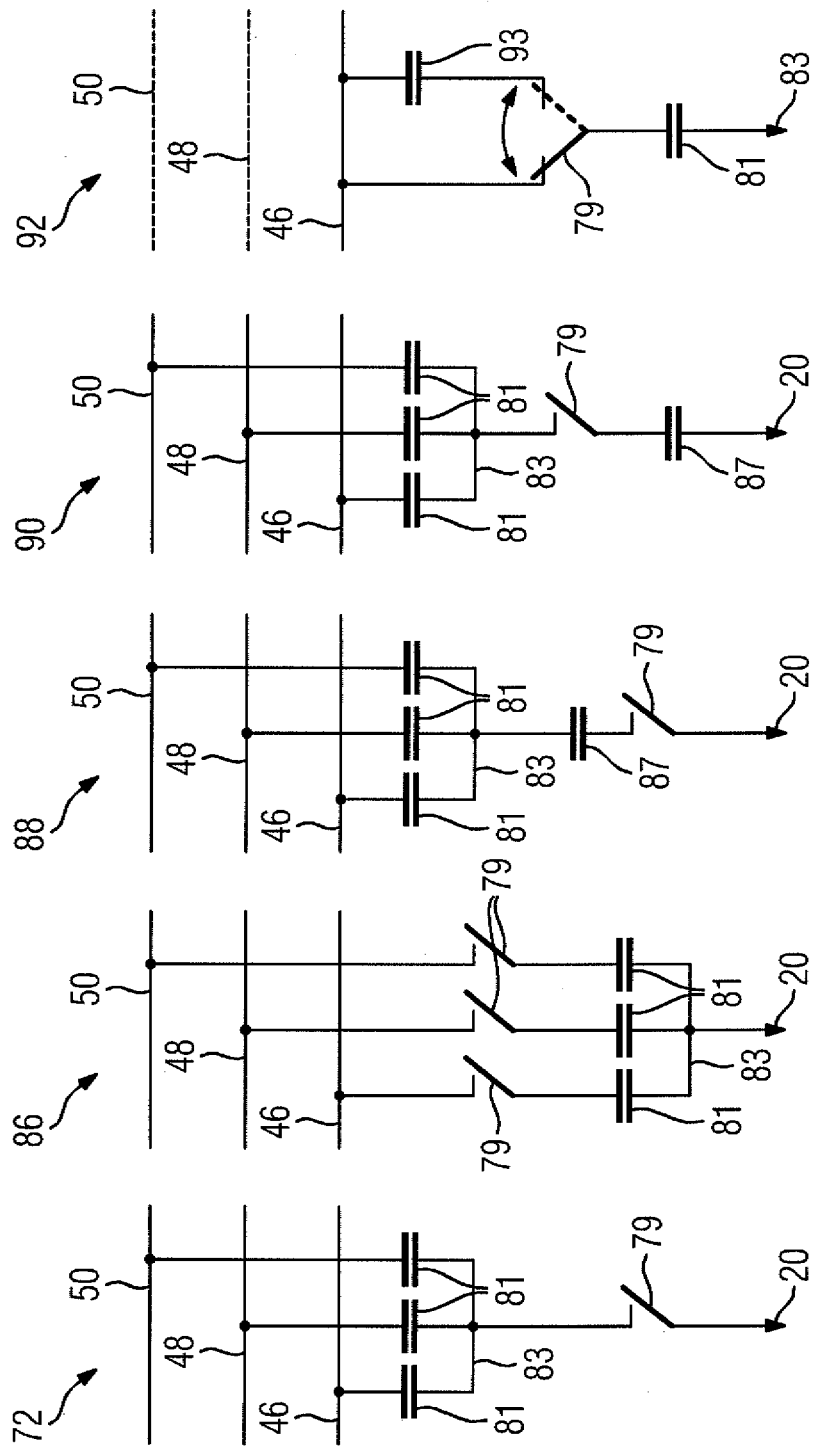
FIG. 5 shows different exemplary topologies for a line filter circuit that is controllable by one embodiment of a device.

FIG. 5 illustrates different topologies for the controlled filter 72 in FIG. 4. In FIG. 5, the same elements are provided with the same reference characters as in FIG. 4 and are not described again.

In the first topology 72, which is already shown in FIG. 4, the neutral point 83 may be isolated from ground 20 by the switch 79. In contrast, in an alternative topology 86, each capacitor 81 may be isolated individually from ground 20 by a switch 79, so that in phases 46, 48, 50 that are not affected by a leakage current, ground leakage currents with frequencies in the range of the power current may continue to be filtered.

In a third topology 88, the neutral point 83 may be grounded via a Y-capacitor 87. In this case, the switch 79 to isolate the controlled filter from ground 20 may, as viewed from ground 20, be arranged upstream of the Y-capacitor 87. In a fourth topology 90, which is structured the same as the third topology 88, the switch 79 may, as viewed from ground 20, be arranged downstream of the Y-capacitor 87.

In a fifth topology 92, which is illustrated for the first phase 46, an additional XY-capacitor 93 may be connected to the XY-capacitor 81 via the switch 79 in the event of a fault. This additional XY-capacitor 93 may be dimensioned to be very small so that in the event of a fault, the additional XY-capacitor 93 increases the limit frequency of the controlled filter 72 and thus reduces the leakage current 28 in the event of a fault.

In the exemplary embodiments, a capacitor for grounding ground leakage currents in a power supply network is adjusted in the event of a fault such that the filtering of ground leakage currents that have a frequency of the power current of the power supply network is ruled out.

Although the invention is illustrated and described in greater detail using the preferred exemplary embodiment, the invention is not restricted by the examples disclosed, and other variations may be derived therefrom by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for improving the filter effect of a filter connected up between an electrical energy source and a source of interference, the filter configured to feed back interference transients from ground to an input of the source of interference generating the interference transients, the device comprising:
    a measuring device operable to determine a leakage current flowing through the filter; and
    a final control element configured to modify a limit frequency of the filter such that the leakage current through the filter is damped to below a predefined level when the measuring device detects the leakage current.

2. The device as claimed in claim 1, wherein the final control element comprises a switch configured to interrupt the leakage current through the filter when the measuring device detects the leakage current.

3. The device as claimed in claim 1, wherein the filter comprises at least one capacitor, and
    wherein the final control element is configured to modify the capacitor to modify the limit frequency of the filter.

4. The device as claimed in claim 1, wherein the electrical energy source is operable to output multiphase electrical energy to the source of interference, and
    wherein the filter is operable to feed back the interference transients from the ground to the input of the source of interference in all phases, the measuring device for determining the leakage current being configured to detect an asymmetrical electrical energy output from the electrical energy source.

5. The device as claimed in claim 4, wherein the measuring device is configured to detect the asymmetrical electrical energy output based on phase currents of the electrical energy source, phase voltages of the electrical energy source, common-mode interference in individual phases between the electrical energy source and the source of interference, a voltage drop from an artificial neutral point in the filter to ground, or a combination thereof.

6. The device as claimed in claim 2, wherein the filter comprises at least one capacitor, and
    wherein the final control element is configured to modify the capacitor to modify the limit frequency of the filter.

7. The device as claimed in claim 6, wherein the electrical energy source is operable to output multiphase electrical energy to the source of interference, and
    wherein the filter is operable to feed back the interference transients from the ground to the input of the source of interference in all phases, the measuring device for determining the leakage current being configured to detect an asymmetrical electrical energy output from the electrical energy source.

8. A filter for relaying electrical energy from an electrical energy source to a source of interference and for feeding back interference transients from ground to an input of the source of interference generating the interference transients, the filter comprising:
    a device comprising:
        a measuring device operable to determine a leakage current flowing through the filter; and
        a final control element configured to modify a limit frequency of the filter such that the leakage current through the filter is damped to below a predefined level when the measuring device detects the leakage current.

9. The filter as claimed in claim 8, further comprising:
    a first capacitor; and
    a second capacitor that is connected in parallel to the first capacitor,
    wherein the first capacitor is configured to conduct interference transients with a frequency of the leakage current, and the second capacitor is configured to conduct the interference transients with a frequency different from the frequency of the leakage current.

10. The filter as claimed in claim 9, wherein the final control element is configured to electrically isolate the first capacitor from the filter when the measuring device detects the leakage current.

11. A network for supplying electrical energy to an electrical consumer from an electrical energy source, the network comprising:
    the electrical consumer;
    an electrical transformer operable to transform a line voltage from the network into a load voltage for the electrical consumer; and
    a filter for relaying the electrical energy from the electrical energy source to a source of interference and for feeding back interference transients from ground to an input of the source of interference generating the interference transients, the filter comprising:
        a device comprising:
            a measuring device operable to determine a leakage current flowing through the filter; and
            a final control element configured to modify a limit frequency of the filter such that the leakage current through the filter is damped to below a predefined level when the measuring device detects the leakage current,
    wherein the electrical transformer is the source of interference.

12. The network as claimed in claim 11, wherein the leakage current has a frequency of a current emitted by the electrical energy source.

13. The network as claimed in claim 11, wherein the electrical transformer comprises a rectifier.

14. The network as claimed in claim 11, wherein the final control element is operable to switch the electrical transformer into a passive operating mode when the measuring device determines the leakage current.

15. The network as claimed in claim 11, wherein the final control element is operable to reduce an electrical power output of the electrical transformer when the measuring device determines the leakage current.

16. The network as claimed in claim 12, wherein the electrical transformer comprises a rectifier.

17. The network as claimed in claim 12, wherein the final control element is operable to switch the electrical transformer into a passive operating mode when the measuring device determines the leakage current.

18. The network as claimed in claim 13, wherein the final control element is operable to switch the electrical transformer into a passive operating mode when the measuring device determines the leakage current.

19. The network as claimed in claim 12, wherein the final control element is operable to reduce an electrical power output of the electrical transformer when the measuring device determines the leakage current.

20. A method for protecting a filter operable to feed back interference transients from ground to an input of a source of interference generating the interference transients, the method comprising:
   detecting a leakage current flowing through the filter; and
   modifying a limit frequency of the filter such that the leakage current through the filter is damped to below a predefined level when the leakage current is detected.

* * * * *